United States Patent
Fornara et al.

(10) Patent No.: US 10,242,944 B2
(45) Date of Patent: Mar. 26, 2019

(54) INTEGRATED CIRCUIT COMPRISING AN ANTIFUSE STRUCTURE AND METHOD OF REALIZING

(71) Applicant: STMicroelectronics (Rousset) SAS, Rousset (FR)

(72) Inventors: Pascal Fornara, Pourrières (FR); Christian Rivero, Rousset (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 0 days.

(21) Appl. No.: 15/610,323

(22) Filed: May 31, 2017

(65) Prior Publication Data

US 2018/0130740 A1 May 10, 2018

(30) Foreign Application Priority Data

Nov. 8, 2016 (FR) .................................. 16 60777

(51) Int. Cl.
  *H01L 23/525* (2006.01)
  *H01L 21/768* (2006.01)
  *H01L 23/522* (2006.01)

(52) U.S. Cl.
  CPC .... *H01L 23/5252* (2013.01); *H01L 21/76877* (2013.01); *H01L 23/5226* (2013.01)

(58) Field of Classification Search
  CPC ........... H01L 23/5252; H01L 27/11206; H01L 23/5254
  See application file for complete search history.

(56) References Cited

U.S. PATENT DOCUMENTS

| | | | |
|---|---|---|---|
| 2002/0063305 A1* | 5/2002 | Koike | H01L 23/5254 257/529 |
| 2004/0140872 A1 | 7/2004 | Wong | |
| 2007/0018761 A1 | 1/2007 | Yamanaka et al. | |
| 2007/0253236 A1* | 11/2007 | Nakazawa | G11C 5/145 365/96 |

FOREIGN PATENT DOCUMENTS

| | | |
|---|---|---|
| CN | 105826297 A | 8/2016 |
| FR | 2984009 A1 | 6/2013 |
| JP | 11330254 A | 11/1999 |

OTHER PUBLICATIONS

Helfmeier, C. et al., "Breaking and Entering through the Silicon," 20th ACM Conference on Computer and Communications Security, (ACM CCS 2013), Berlin, Germany, 2013, 11 pages.

Vayrette, R. et al., "Residual stress estimation in damascene caper interconnects using embedded sensors," Microelectronic Engineering, vol. 87, Issue 3, Mar. 2010, pp. 412-415.

* cited by examiner

Primary Examiner — Jay C Chang
Assistant Examiner — Mikka Liu
(74) Attorney, Agent, or Firm — Slater Matsil, LLP

(57) ABSTRACT

An integrated circuit includes a substrate; an interconnect portion disposed over the substrate, the interconnect portion comprising multiple metallization levels separated by an insulating region; and an antifuse structure coated with a portion of the insulating region, the antifuse structure comprising a beam held at two different points by two arms, a body, and an antifuse insulating zone, the beam, the body and the arms being metal and located within a same metallization level, the body and the beam mutually making contact via the antifuse insulating zone, the antifuse insu- (Continued)

lating zone configured to undergo breakdown in the presence of a breakdown potential difference between the body and the beam.

25 Claims, 5 Drawing Sheets

INTEGRATED CIRCUIT COMPRISING AN ANTIFUSE STRUCTURE AND METHOD OF REALIZING

CROSS-REFERENCE TO RELATED APPLICATIONS

This application claims priority to French Patent Application No. 1660777, filed on Nov. 8, 2016, which application is hereby incorporated herein by reference.

TECHNICAL FIELD

The invention relates to integrated circuits and, more particularly, the antifuse structures that are present within these integrated circuits.

BACKGROUND

Currently, antifuse structures are generally based on the breakdown of an oxide located between an active region of an integrated circuit and a polysilicon line. Before the oxide undergoes electrical breakdown, it is an insulator and no current passes between the polysilicon line and the active region of the integrated circuit.

However, when a breakdown potential difference is applied between the polysilicon line and the active zone of the integrated circuit, the oxide then undergoes breakdown and becomes a conductor.

Breakdown is irreversible.

Thus, such an antifuse structure may behave in operation as a one-time programmable memory cell (OTP cell).

Specifically, the memory cell then passes from a non-conductive state to a conductive state, which makes it possible to store a bit the logic value of which depends on the state of the memory cell.

Antifuse structures are often used in products. Additionally, when they are used to code secret information, they are then subject to reverse engineering.

However, the current antifuse structures can easily be observed by failure analysis using suitable tools such as scanning electron microscopes (SEM), which make it possible, after removal of the polysilicon layer, to determine the state of the oxide.

SUMMARY

According to one mode of implementation and embodiment, an antifuse structure is proposed that is both simple to manufacture and difficult to analyze in a reverse engineering operation.

Thus, according to one embodiment, an antifuse structure is proposed that is positioned in the interconnect portion (back end of line, or BEOL) of the integrated circuit, thereby making it particularly resistant to a reverse engineering operation since it does not make direct contact with the substrate of the integrated circuit. Additionally, this antifuse structure is based in particular on a metal oxide that is grown in a step of manufacturing the structure, which oxide is therefore particularly thin and the state of which, i.e. whether or not it has undergone breakdown, is almost impossible to determine visually.

According to one aspect, an integrated circuit is proposed that comprises, on top of a substrate, an interconnect portion (BEOL portion) comprising multiple metallization levels separated by an insulating region, typically an inter-metal dielectric (IMD).

According to one general feature of this aspect, the integrated circuit additionally comprises, within the interconnect portion, at least one antifuse structure coated with a portion of the insulating region.

This antifuse structure comprises a beam held at two different points by two arms, a body and an antifuse insulating zone.

The beam, the body and the arms are metal and located within the same metallization level.

The body and the beam mutually make contact via the antifuse insulating zone which is configured to undergo breakdown in the presence of a breakdown potential difference between the body and the beam.

According to one embodiment, the beam, the two arms and the body comprise a first metal, for example copper or aluminum, and the antifuse insulating zone comprises an oxide of this first metal.

The thickness of the antifuse insulating zone is advantageously very low, since it is formed in particular by growing an oxide in a step of manufacturing the structure. By way of indication, the thickness of the antifuse insulating zone is at least equal to 2 nm and less than or equal to 20 nm.

According to one embodiment, the two arms extend substantially in parallel to a first direction and the beam has a non-zero angular deviation with respect to a second direction that is orthogonal to the first direction, thereby allowing it to come into contact with the body, for example an abutment.

According to one embodiment, the two arms are respectively secured to the beam on two opposite faces of the beam, in the vicinity of the central portion of the beam, the two fixation points at which the two arms are fixed to the beam being spaced apart in the longitudinal direction of the beam.

According to one embodiment, the body may comprise an abutment in contact with one of the ends of the beam via the antifuse insulating zone.

In a variant, the antifuse insulating zone may comprise two antifuse portions and the body may then comprise two abutments in contact with the two ends of the beam, respectively, via the two antifuse portions. At least one of the two antifuse portions is configured to undergo breakdown in the presence of the breakdown potential difference between at least one of the abutments and the beam.

The integrated circuit may comprise multiple antifuse structures.

At least one of the antifuse structures may comprise an antifuse insulating zone that has undergone breakdown and at least one of the antifuse structures may comprise an antifuse insulating zone that has not undergone breakdown.

According to another aspect, a system is proposed that comprises an integrated circuit such as defined above and circuitry configured to apply the breakdown potential difference across at least one of the antifuse structures.

These circuitry may or may not belong to the integrated circuit.

According to yet another aspect, a method is proposed for manufacturing an integrated circuit comprising at least one antifuse structure.

The method comprises: forming at least one first insulating intermediate region, for example an inter-metal dielectric (IMD), on top of a substrate; forming, within a metallization level resting on the first insulating intermediate region, at least one metal intermediate structure comprising a body and a beam held at two points by two arms (this metallization level may be any metallization level of the interconnect portion of the integrated circuit); removing at least part of the first insulating intermediate region located below the intermediate structure so as to free this intermediate structure and to allow the beam to move in order to allow it to come into contact with the body via an insulating zone resulting from an oxidation of the metal of the intermediate structure at least during the freeing operation so as to form the antifuse structure, the at least one insulating zone forming an antifuse insulating zone configured to undergo breakdown in the presence of a breakdown potential difference between the body and the beam; and coating the antifuse structure with a second insulating intermediate region, for example a second inter-metal dielectric layer.

BRIEF DESCRIPTION OF THE DRAWINGS

Other advantages and features of the invention will become apparent upon examining the detailed description of modes of implementation and embodiments, which are non-limiting, and the appended drawings in which.

DETAILED DESCRIPTION OF ILLUSTRATIVE EMBODIMENTS

Figure 1:
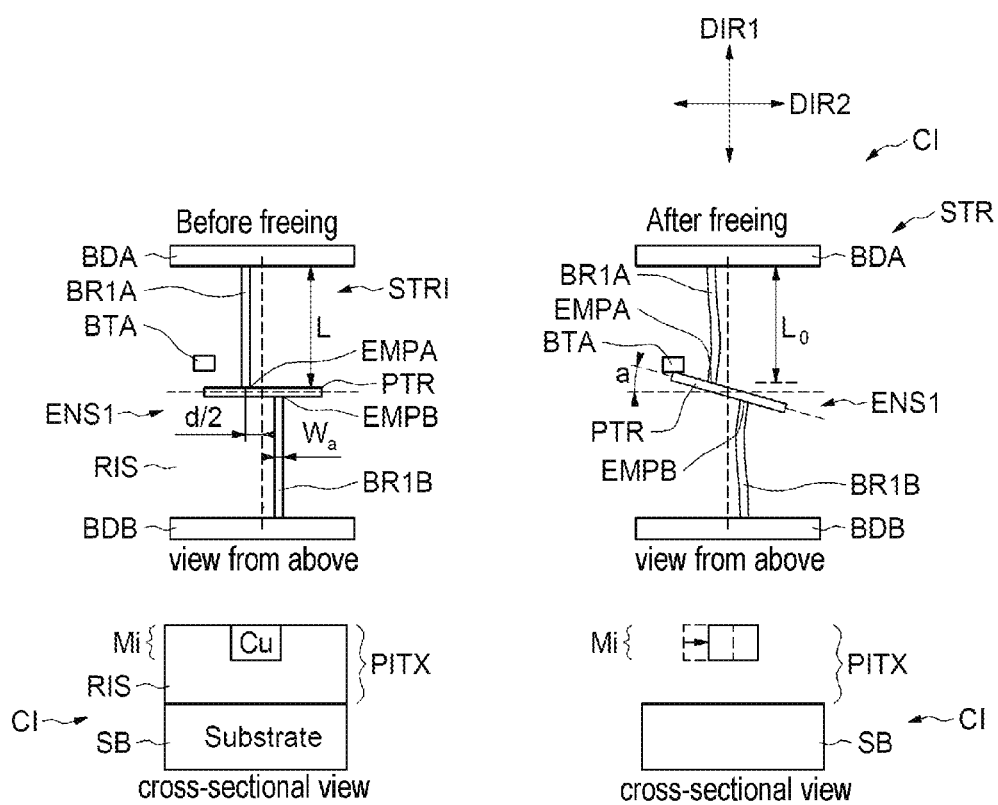
FIGS. 1 to 10, some of which are schematic, relate to various modes of implementation and embodiments of the invention.

Referring to FIG. 1, it can be seen that the antifuse structure STR is formed within one and the same metallization level Mi of the interconnect portion PITX of an integrated circuit CI, this interconnect portion also commonly being referred to by those skilled in the art by the acronym BEOL.

This portion PITX is located on top of the substrate SB.

In the examples described here, the structure STR is metal, for example made of copper or else of aluminum, while not being limited to these two examples.

As will be seen in more detail below, the antifuse structure STR (right-hand portion of FIG. 1) is obtained from a metal intermediate structure STRI (left-hand portion of FIG. 1) which is formed on top of an insulating region RIS of the portion PITX, typically an inter-metal dielectric material layer (IMD). The structure STR is formed after freeing (de-encapsulating) the intermediate structure STRI of the subjacent insulating layer RIS.

The intermediate structure STRI here comprises an assembly ENS1 in the shape of an asymmetrical cross.

This assembly ENS1 comprises a first arm BR1A and a second arm BR1B secured to a beam PTR at two points EMPA and EMPB which are respectively located on two opposite faces of the beam PTR. These two points EMPA and EMPB are spaced apart by a distance d (the distance d/2 is shown in FIG. 1).

The two arms are furthermore secured to the metal portions BDA, BDB, respectively.

As will be seen in more detail below, the assembly ENS1 is produced using conventional techniques for forming metal tracks of the interconnect portion PITX, which are used in the context of CMOS technology in particular.

The intermediate structure STRI also comprises, besides the assembly ENS1, at least one body, for example an abutment BTA, formed within the same metallization level Mi.

As mentioned above, the left-hand portion of FIG. 1 shows the structure STRI resting on the subjacent insulating region RIS with the end of the beam PTR located at a distance from the abutment BTA. The subjacent region RIS therefore prevents any movement of the assembly ENS1 here.

The right-hand portion of FIG. 1 shows the antifuse structure STR obtained after freeing the intermediate structure STRI. This freeing, or de-encapsulating, operation is carried out here by etching the subjacent insulating region RIS so as to free the arms BR1A and BR1B and the beam PTR.

In the article by R. Vayrette et al. entitled: "Residual stress estimation in damascene copper interconnects using embedded sensors", Microelectronics Engineering 87 (2010) 412-415, it has been shown that after de-encapsulation of an assembly of this type, relaxation of stresses occurs, thereby causing a residual longitudinal deformation of the arms causing an angular deviation a of the beam, here clockwise.

More specifically, assuming an arm of constant width $W_a$, the deviation a is expressed by the following formula:

$$a = \frac{d \cdot L \cdot L_0 (L - L_0)}{d^2(2L - L_0) + \frac{4}{3} \cdot W_a^2 \cdot L_0}$$

where $L_o$ is the length of the arm after relaxation and is equal to:

$$\frac{L}{1 + \frac{\sigma}{E}}$$

and where σ denotes the residual mean longitudinal stress and E denotes the Young's modulus of the material (roughly equal to 130 GPa for isotropic copper and equal to 63 GPa for aluminum).

σ is determined experimentally on the basis of measurements made on test structures having various values of d and various values of $W_a$. Thus, for 1/d equal to 2 μm$^{-1}$ and $W_a$ equal to 0.5 μm, the value of σ is roughly 800 MPa.

By way of indication, for arms of 10 microns in length and of 0.2 microns in width, the deviation of the pointer is of the order of 0.2 microns for a spacing d of 2 microns. For a spacing of 1 micron, a deviation a of the order of 0.3 microns is obtained. This corresponds to structures annealed at 400° with an insulating region RIS of 0.56 microns.

For a line width (arm width) of the order of 0.2 microns, this gives a mean longitudinal residual deformation of between 0.25% and 0.30% for a line width (arm width) of 0.5 microns, 0.20% for a line width of 1 micron, and slightly less than 0.20% for a line width of 2 microns.

Thus, after freeing, the two arms BR1A and BR1B extend substantially in parallel to a first direction DIR1, and the beam PTR has a non-zero angular deviation "a" with respect to a second direction DIR2 that is orthogonal to the first direction.

By virtue of this relaxation of the stresses and the residual longitudinal deformation of the arms causing the angular deviation "a" of the beam PTR, the end of the latter comes into contact with the abutment BTA.

The structure STR is subsequently encapsulated anew in the insulating region RIS by depositing a material of IMD type, as illustrated schematically in FIG. 2.

Figure 2:
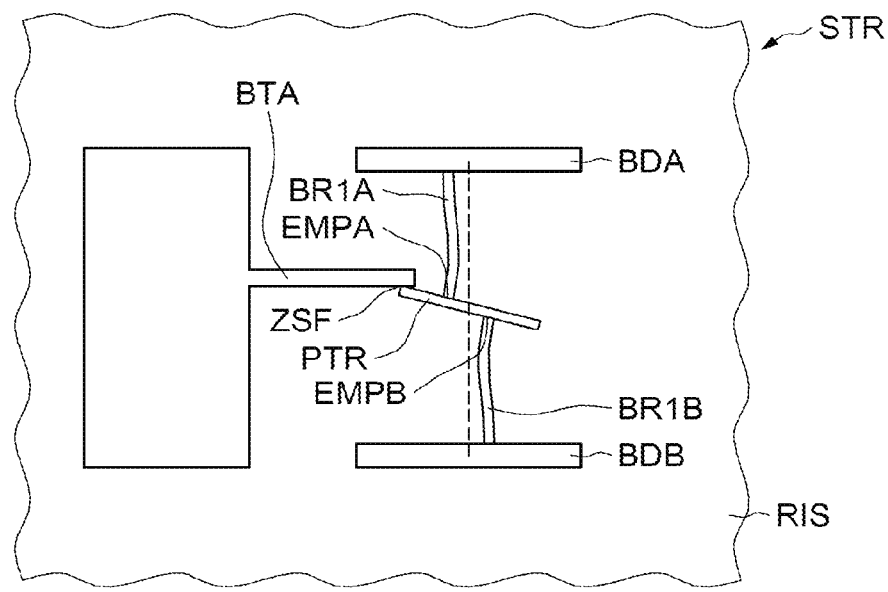

In this FIG. 2, which schematically illustrates a particular form of abutment BTA, it can be seen that the contact between the beam PTR and the abutment BTA is achieved via an antifuse insulating zone ZSF.

Figure 3:
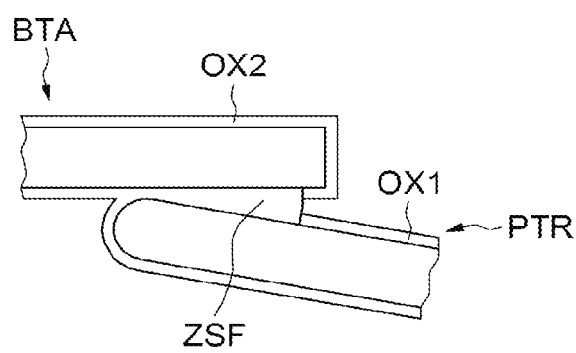

As illustrated in greater detail in FIG. 3, the beam PTR and the abutment BTA, both metal, are covered with a metal oxide OX1, OX2, respectively, resulting, as will be seen below, from the method of manufacturing the structure STR.

Consequently, the antifuse insulating zone ZSF comprises the oxide OX1 and the oxide OX2.

By way of non-limiting example, when the abutment BTA and the beam PTR are made of aluminum, the oxides OX1 and OX2 are made of alumina ($Al_2O_3$). The thickness of each layer of oxide OX1, OX2 is for example of the order of 7 to 8 nanometers, thereby leading to a thickness of the zone ZSF of the order of 14 to 16 nanometers at the thickest point.

However, more generally, the thickness of the zone ZSF may be considered to be between 2 nm and 20 nm.

This antifuse insulating zone ZSF is capable of undergoing breakdown in the presence of a breakdown potential difference between the body and, in this instance, the abutment BTA and the beam PTR.

Figure 4:
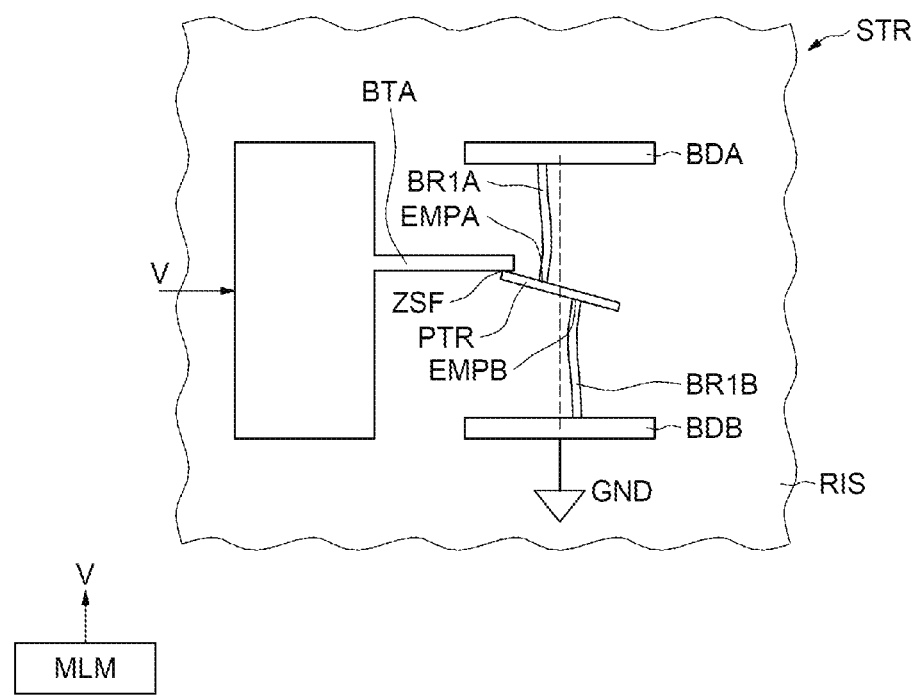

As such, as illustrated in FIG. 4, provision is made for circuitry MLM, which may or may not be incorporated into the integrated circuit containing the structure STR, that are capable of applying a voltage V to the abutment BTA while the portion BDB for example, is at ground potential GND.

Figure 5:
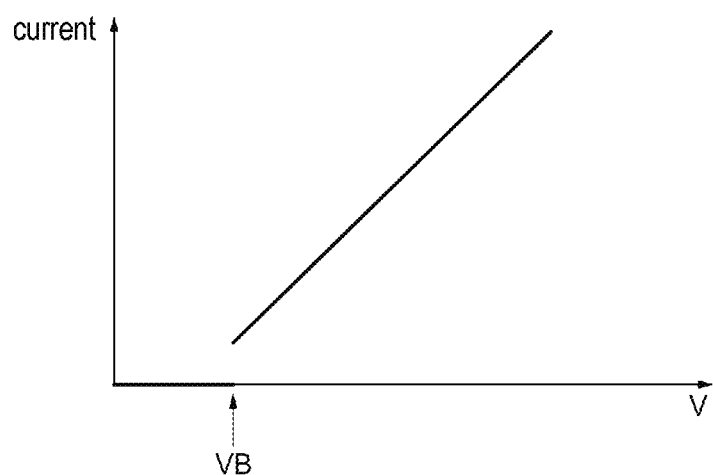

Additionally, as illustrated schematically in FIG. 5, as long as the voltage V does not reach the breakdown voltage VB, no current flows between the abutment BTA and the beam PTR.

However, as soon as the voltage V reaches the breakdown voltage VB, the zone ZSF acquires at least one electrically conductive path allowing a current to flow between the abutment BTA and the beam PTR.

By way of non-limiting example, for a beam PTR and an abutment BTA made of aluminum covered with alumina with a thickness of the order of a few tens of nanometers, the breakdown voltage VB is located at about 5 volts and, after breakdown, it is shown that there is a contact resistance of the order of 30 ohms, which is representative of a welded joint between the beam PTR and the abutment BTA.

The placement of the antifuse structure STR in the interconnect portion PITX of the integrated circuit coated with the insulation region RIS, combined with the antifuse zone ZSF formed from a native metal oxide, makes it almost impossible to detect, using conventional failure analysis such as scanning electron microscopy (SEM), whether or not the structure STR has undergone breakdown.

The only way for third parties who desire to determine whether or not the structure has undergone breakdown would be to test it electrically. However, this becomes very tedious, or even economically unrealistic, when the integrated circuit IC comprises, as illustrated in FIG. 6, a multitude of antifuse structures STRi.

Moreover, it would be possible to envisage producing a metal shield above and below these structures in order to make accessing these structures even more difficult.

Figure 6:
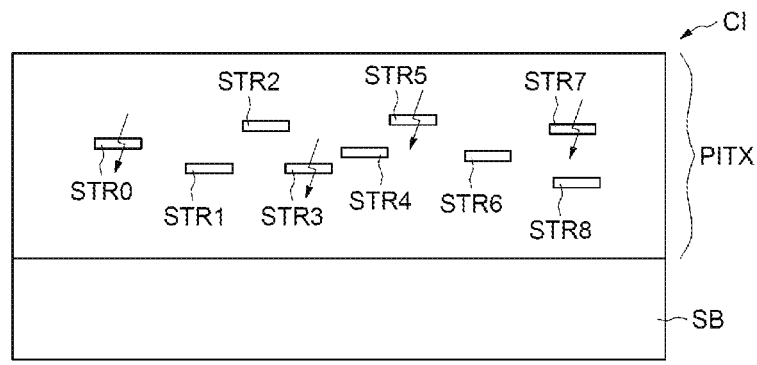

In FIG. 6, nine antifuse structures STR0-STR8, formed in the interconnect portion PITX of the integrated circuit within various metallization layers, are shown.

The antifuse zones of some of these structures, such as for example the structures STR0, STR3, STR5 and STR7, have undergone breakdown, while those of other structures STR1, STR2, STR4, STR6 and STR8 have not undergone breakdown. It is thus possible to memorize a binary word of nine bits having logic values 0 or 1 as a function of the state of the corresponding antifuse zone ZSF, i.e. whether or not it has undergone breakdown.

Figure 7:
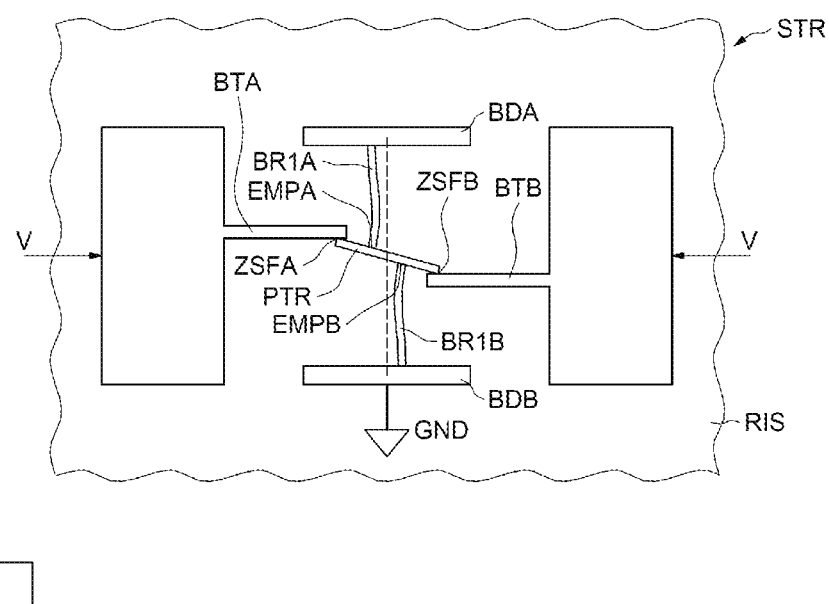

It is possible, as a variant, as illustrated in FIG. 7, for the body of the structure STR to comprise not only a single abutment BTA, but two abutments BTA and BTB.

In this case, the antifuse zone comprises two antifuse insulating portions ZSFA and ZSFB. The two ends of the beam PTR make contact with the two abutments BTA and BTB, respectively, via the two antifuse portions ZSFA and ZSFB.

Additionally, the two antifuse portions ZSFA, ZSFB are capable of undergoing breakdown in the presence of a breakdown voltage V applied to the two abutments BTA and BTB while the beam PTR is at ground potential GND.

It would of course be possible to apply the voltage V only to a single abutment, for example the abutment BTA, and to leave the second abutment floating. In this case only the antifuse insulating portion ZSFA should be capable of undergoing breakdown.

Figure 8:
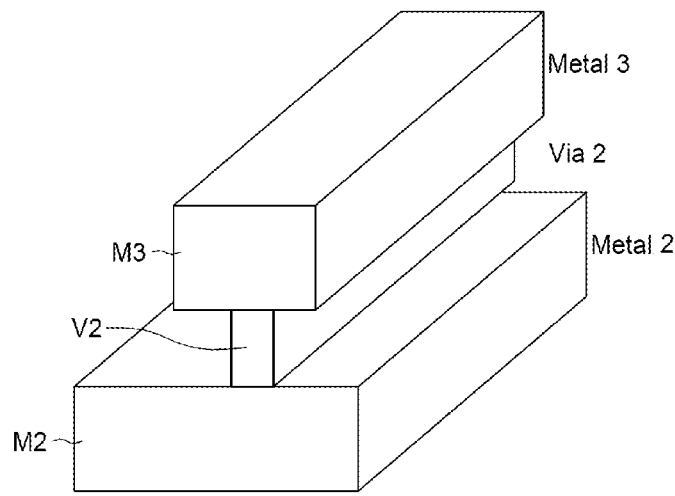
Figure 9:
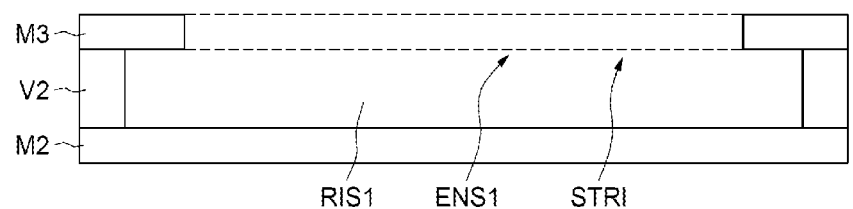
Figure 10:
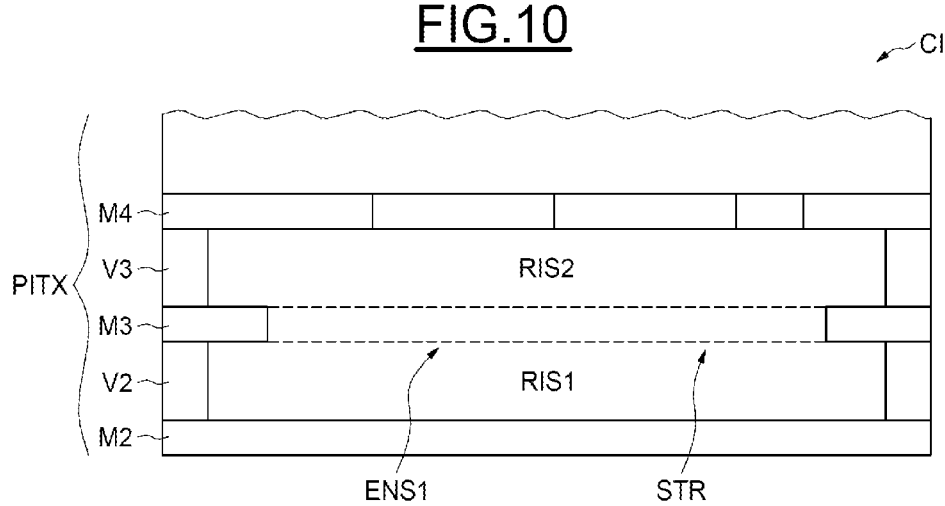

Reference is now more particularly made to FIGS. 8 to 10 in order to describe a mode of implementation of a method for manufacturing an antifuse structure STR.

In these figures it is assumed that the assembly ENS1 and the one or more abutments BTA, BTB are formed in the metallization level M3 (metal 3).

It can then be seen, in FIG. 8, that the level V2 of via 2 between the metal level 2 and the metal level 3 is used to form a protective wall for the oxide etching operation which will follow and allow the assembly ENS1 and the various abutments to be freed.

Furthermore, the moving portion of the structure STR, in this instance the beam PTR, and the body, in this instance the abutment BTA, are formed in the metal level 3, the abutment BTA potentially being connected to the metal level 2 by a via.

The structure STR and, in particular, the assembly ENS1 are produced using conventional steps of manufacturing metallization levels and vias. More specifically, as illustrated in FIG. 9, after forming the metal level M2 and the via level V2, the assembly ENS1, shown here by dotted lines for the sake of simplicity, and the one or more abutments of the intermediate structure STRI are produced in a conventional manner by etching the subjacent inter-metal dielectric (which is referred to here as the first intermediate insulating region RIS1) and depositing metal, in this instance aluminum, in the trenches thus obtained.

At this stage, there is already a growth of oxide on the metal portions that are in contact with the ambient air.

Next, isotropic dry etching followed by wet etching, for example with hydrofluoric acid, is carried out in order to remove the insulating region (oxide) confining the assembly ENS1 and the one or more various abutments in order to free the intermediate structure STRI and to allow the beam to come into contact with the one or more abutments.

After the wet etching, the aluminum oxide has almost disappeared, but as soon as the structure is brought back into contact with the air during its freeing the same thickness of aluminum oxide returns (the oxidation is mainly due to the structure being brought into contact with the air). The growth of the oxide on the beam and the one or more abutments will allow the antifuse insulating zone ZSF to be formed when the two metal oxide layers covering the beam and the one or more abutments, respectively, come into contact during the angular deviation of the beam.

Next, as illustrated in FIG. 10, the antifuse structure STR thus produced is covered with a new layer of inter-metal insulating material (which is referred to here as the second intermediate insulating region RIS2) which will form part of the insulating region RIS of the interconnect portion PITX. The structure STR is therefore encapsulated within a portion of the insulating region RIS of the interconnect portion PITX and the conventional method for producing various higher metallization M4 and via V3 levels is subsequently carried out.

What is claimed is:

1. An integrated circuit comprising:
   a substrate;
   an interconnect portion disposed over the substrate, the interconnect portion comprising:
      a plurality metallization levels separated by an insulating region; and
      an antifuse structure coated with a portion of the insulating region, the antifuse structure comprising:
         a beam held at two different points by two arms,
         a body, and
         an antifuse insulating zone, the beam, the body and the arms being metal and located within a same metallization level, the body and the beam mutually making contact via the antifuse insulating zone, the antifuse insulating zone configured to undergo breakdown in the presence of a breakdown potential difference between the body and the beam.

2. The integrated circuit of claim 1, wherein the breakdown potential is 5 V.

3. The integrated circuit of claim 1, wherein the beam, the two arms and the body comprise a first metal and the antifuse insulating zone comprises an oxide of the first metal.

4. The integrated circuit of claim 3, wherein the oxide comprises alumina.

5. The integrated circuit of claim 3, wherein the oxide has a thickness between 7 nm and 8 nm.

6. The integrated circuit of claim 3, wherein the first metal is copper or aluminum.

7. The integrated circuit of claim 3, wherein a thickness of the antifuse insulating zone is between 2 nm and 20 nm.

8. The integrated circuit of claim 1, wherein the two arms extend substantially parallel to a first direction, and the beam has a non-zero angular deviation with respect to a second direction that is orthogonal to the first direction.

9. The integrated circuit of claim 1, wherein
   the two arms are respectively secured to the beam on two opposite faces of the beam; and
   in the vicinity of a central portion of the beam, two fixation points at which the two arms are fixed to the beam are spaced apart in a longitudinal direction of the beam.

10. The integrated circuit of claim 1, wherein the body comprises an abutment in contact with one of a plurality of ends of the beam via the antifuse insulating zone.

11. The integrated circuit of claim 1, wherein the antifuse insulating zone comprises two antifuse portions, the body comprises two abutments in contact with two ends of the beam, respectively, via the two antifuse portions, at least one of the two antifuse portions being configured to undergo breakdown in the presence of the breakdown potential difference between at least one of the abutments and the beam.

12. The integrated circuit of claim 1, further comprising multiple antifuse structures.

13. The integrated circuit of claim 12, wherein at least one of the antifuse structures comprises an antifuse insulating zone that has undergone breakdown and at least one of the antifuse structures comprises an antifuse insulating zone that has not undergone breakdown.

14. The integrated circuit of claim 13, wherein the antifuse insulating zone that has undergone breakdown has a resistance between the beam and an abutment of 30 ohms.

15. A system comprising:
   an integrated circuit comprising a first antifuse structure, the first antifuse structure comprising:
      a beam held at two different points by two arms,
      a first body, and
      a first antifuse insulating zone coupled between the beam and the first body, the beam, the first body, and the two arms being metal and located in a same metallization level, the first antifuse insulating zone configured to undergo breakdown.

16. The system of claim 15, further comprising a circuit configured to apply a voltage between the first body and the beam.

17. The system of claim 15, further comprising:
   a second body, and
   a second antifuse insulating zone coupled between the beam and the second body, the second antifuse insulating zone configured to undergo breakdown when a breakdown voltage is applied between the second body and the beam.

18. The system of claim 17, wherein the first body and second body are located in opposite ends of the beam.

19. The system of claim 15, wherein the first antifuse insulating zone is configured to undergo breakdown when a breakdown voltage is applied between the first body and the beam.

20. The system of claim 15, wherein the two arms extend substantially parallel to a first direction, wherein the beam has a non-zero angular deviation with respect to a second direction that is orthogonal to the first direction, wherein one of the two arms has a first constant width, and wherein the non-zero angular deviation is based on the first constant width, a distance between the two different points, and a length of the one of the two arms.

21. An integrated circuit comprising:
   a substrate;
   an interconnect portion disposed over the substrate, the interconnect portion comprising:
      a plurality of metallization levels separated by an insulating region; and
      a plurality of antifuse structures, wherein each antifuse structure of the plurality of antifuse structures comprises:
         a beam held at two different points by two arms,
         a body, and
         an antifuse insulating zone, the beam, the body and the arms being metal and located within a same metallization level, the body and the beam mutually making contact via the antifuse insulating zone, the antifuse insulating zone comprising an oxide and configured to undergo breakdown in the presence of a breakdown potential difference between the body and the beam.

22. The integrated circuit of claim 21, wherein the two different points are equidistant to a center line that is substantially parallel to the two arms.

23. The integrated circuit of claim 21, wherein each of the beam, the two arms and the body comprises copper.

24. The integrated circuit of claim 21, wherein each of the antifuse structures is configured to, after the breakdown, carry a current between the body and the beam that linearly increases with respect to a potential difference between the body and the beam.

25. An integrated circuit comprising:
   a substrate;
   an interconnect portion disposed over the substrate, the interconnect portion comprising:
      a plurality metallization levels separated by an insulating region; and
      an antifuse structure coated with a portion of the insulating region, the antifuse structure comprising:
         a beam held at two different points by two arms,
         a body, and
         an antifuse insulating zone, the beam, the body and the arms being metal and located within a same metallization level, the body and the beam mutually making contact via the antifuse insulating zone.

* * * * *